United States Patent [19]
Lou

[11] Patent Number: 6,090,679
[45] Date of Patent: Jul. 18, 2000

[54] METHOD FOR FORMING A CROWN CAPACITOR

[75] Inventor: Chine-Gie Lou, Hsinchu Hsien, Taiwan

[73] Assignee: Worldwide Semiconductor Manufacturing Corporation, Hsinchu, Taiwan

[21] Appl. No.: 09/201,280

[22] Filed: Nov. 30, 1998

[51] Int. Cl.$^7$ ...................................................... H01L 21/20
[52] U.S. Cl. .......................... 438/396; 438/397; 438/398; 438/573
[58] Field of Search ..................................... 438/573, 605, 438/396, 397, 398, 253, 254, 255, 665, 964, 482

[56] References Cited

U.S. PATENT DOCUMENTS

| | | | |
|---|---|---|---|
| 5,340,765 | 8/1994 | Dennison et al. | 438/398 |
| 5,668,038 | 9/1997 | Huang et al. | 438/396 |
| 5,817,565 | 10/1998 | Chao | 438/396 |
| 5,843,818 | 12/1998 | Joo et al. | 438/240 |
| 5,959,326 | 9/1999 | Aiso | 257/306 |
| 6,037,219 | 3/2000 | Lin et al. | 438/255 |

*Primary Examiner*—Carl Whitehead, Jr.
*Assistant Examiner*—Jamie Davis
*Attorney, Agent, or Firm*—Blakely Sokoloff Taylor & Zafman

[57] ABSTRACT

A method for forming a bottom storage node of a crown-shaped DRAM capacitor on a substrate is disclosed. The method comprises the steps of: forming a first insulating layer onto said substrate; forming a barrier layer onto said first insulating layer; patterning and etching said first insulating layer and said barrier layer, and stopping at said substrate, to form a contact opening; forming an amorphous silicon plug into said contact opening; forming a second insulating layer onto said amorphous silicon plug and said barrier layer; patterning and etching said second insulating layer, stopping at said barrier layer, to form a trench above said amorphous silicon plug; forming a bottom amorphous silicon layer along the bottom and sidewalls of said trench; forming a middle amorphous silicon layer atop said bottom amorphous silicon layer; forming a top amorphous silicon layer atop said middle amorphous silicon layer, wherein said top amorphous silicon layer is undoped, and wherein said middle amorphous silicon layer and said bottom amorphous silicon layer have different dopant concentrations greater than zero; removing said second insulating layer; removing said barrier layer to expose a portion of said amorphous silicon plug; and forming a hemispherical grain (HSG) polysilicon layer on surfaces of said top amorphous silicon layer and said bottom amorphous silicon layer and on exposed portion of said amorphous silicon plug.

15 Claims, 2 Drawing Sheets

METHOD FOR FORMING A CROWN CAPACITOR

FIELD OF THE INVENTION

This invention relates to semiconductor memories, and more particularly, to an improved method for forming a crown capacitor.

BACKGROUND OF THE INVENTION

It has been a recent trend in dynamic random access memory (DRAM) to increase the density of DRAM integrated circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three-dimensional structure have been suggested to increase cell capacitance. Such capacitors include, for example, double-stacked, fin-structured, cylindrical, spread-stacked, and box structured capacitors.

There is also a challenge to develop methods of manufacturing these capacitors that minimize the depletion problem and provide maximum process tolerance to increase cell capacitance. The present invention is directed to such an improved capacitor.

SUMMARY OF THE INVENTION

A method for forming a bottom storage node of a crown-shaped DRAM capacitor on a substrate is disclosed. The method comprises the steps of: forming a first insulating layer onto said substrate; forming a barrier layer onto said first insulating layer; patterning and etching said first insulating layer and said barrier layer, and stopping at said substrate, to form a contact opening; forming an amorphous silicon plug into said contact opening; forming a second insulating layer onto said amorphous silicon plug and said barrier layer; patterning and etching said second insulating layer, stopping at said barrier layer, to form a trench above said amorphous silicon plug; forming a bottom amorphous silicon layer along the bottom and sidewalls of said trench; forming a middle amorphous silicon layer atop said bottom amorphous silicon layer; forming a top amorphous silicon layer atop said middle amorphous silicon layer, wherein said top amorphous silicon layer is undoped, and wherein said middle amorphous silicon layer and said bottom amorphous silicon layer have different dopant concentrations greater than zero; removing said second insulating layer; removing said barrier layer to expose a portion of said amorphous silicon plug; and forming a hemispherical grain (HSG) polysilicon layer on surfaces of said top amorphous silicon layer and said bottom amorphous silicon layer and on exposed portion of said amorphous silicon plug.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention will be described in detail with reference to the accompanying drawings. The present invention provides a method for forming a crown capacitor which has high capacitance, low depletion, low bald defect, low selective loss and high product yield.

Figure 1:
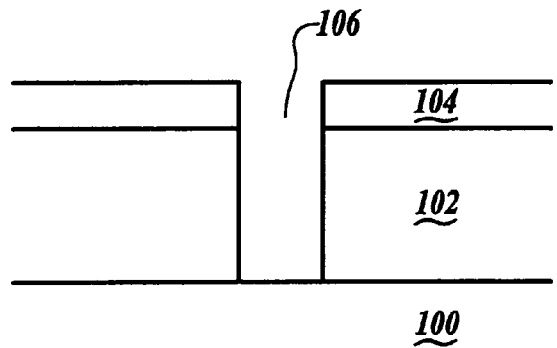
FIGS. 1–5 are cross-sectional views of a semiconductor substrate illustrating the steps of the present invention for forming a crown capacitor.

Turning to FIG. 1, semiconductor substrate 100 is shown. The substrate is understood to include possibly a semiconductor wafer, active and passive devices formed within the wafer, and layers formed on the wafer's surface. The term "substrate" is meant to include devices formed within a semiconductor wafer and the layers overlying the wafer.

In FIG. 1, an insulating layer 102 is formed atop the substrate 100. The insulating layer 102 is preferably formed of a tetraethylorthosilicate (TEOS) oxide layer of about 500–2000 angstroms, followed by a borophosphosilicate glass (BPSG) layer of about 2000–8000 angstroms, followed by a high temperature oxide (HTO) layer of about 500–2000 angstroms. As will be seen in further detail below, the HTO layer will enhance the process window for the formation of HSG polysilicon. A barrier layer 104, preferably about 500–2000 angstroms thick, is deposited atop the insulating layer 102. Preferably, the barrier layer 104 is composed of silicon nitride. Next, a contact opening 106 is made using conventional masking and etching techniques. The etching is performed through the barrier layer 104 and the insulating layer 102, and is controlled to stop at the substrate 100.

Figure 2:
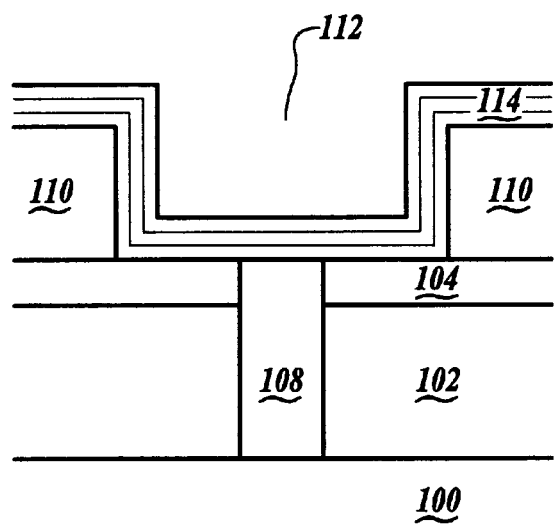

Turning to FIG. 2, an insitu doped amorphous silicon layer is deposited into the contact opening 106 and atop the barrier layer 104. The amorphous silicon may be deposited using any known conventional techniques, such as the use of silane and phosphine as the reactant gas. The deposition temperature is preferably between 500 to 530° C. The dopant concentration is preferably about 1E20 to 3E20 atoms/cm$^3$. A conventional reactive ion etching (RIE) is performed to remove the amorphous silicon atop the barrier layer 104, leaving an amorphous silicon plug 108 in the contact opening 106. Preferably, the diameter of the contact opening 106 is less than 2000 angstroms. The deposition time, therefore, depends on the width of the contact opening 106, rather than on the height of the contact opening 106. The shorter deposition time reduces crystallization of the amorphous silicon. Crystallization of the amorphous silicon inhibits silicon migration resulting in poor HSG formation subsequently formed atop the amorphous silicon.

Still referring to FIG. 2, a second insulating layer 110 is deposited atop the barrier layer 104 and the amorphous silicon plug 108. Preferably, the second insulating layer 110 is formed of silicon oxide. Using conventional masking and etching techniques, a trench 112 is etched into the second insulating layer 110. The etching is controlled to stop at the barrier layer 104.

Next, a composite amorphous silicon layer 114 is deposited along the bottom and sidewalls of the trench 112 and atop the second insulating layer 110. The composite amorphous silicon layer 114 preferably consists of three discrete amorphous silicon layers having different dopant concentrations. For example, a bottom layer of the amorphous silicon layer 114 preferably has a dopant concentration of 2E20 to 3E20 atoms/cm$^3$ and is about 200–500 angstroms. A middle layer of the amorphous silicon layer 114 preferably has a dopant concentration of 5E20 to 1E21 atoms/cm$^3$ and is about 400–800 angstroms thick. Finally, a top layer of the amorphous silicon layer 114 is deposited. The top layer is undoped and is about 300–600 angstroms thick.

Figure 3:
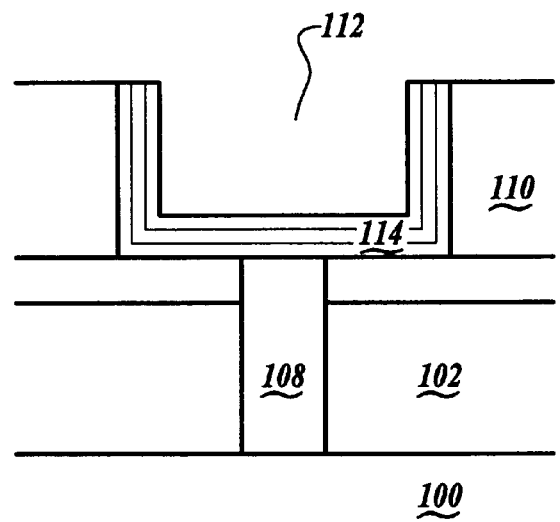

Turning to FIG. 3, the portion of the composite amorphous silicon layer 114 atop the second insulating layer 110 is removed using conventional techniques. Either a chemical mechanical polishing (CMP) or a reactive ion etching (RIE) process (with suitable masking) can be used.

Figure 4:
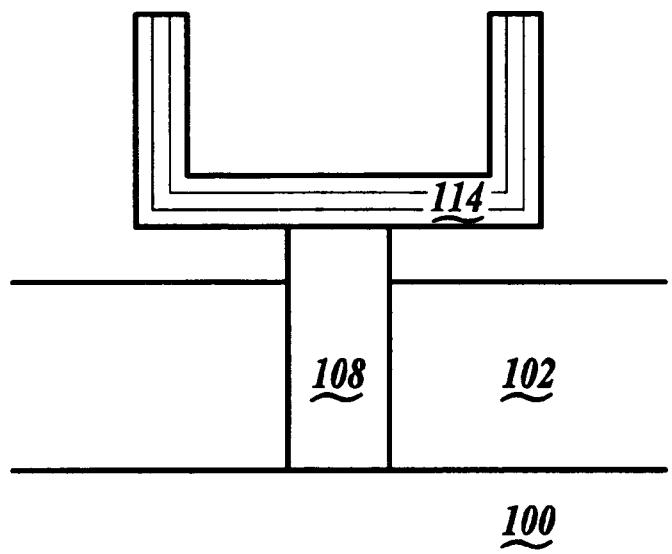

Turning to FIG. 4, an oxide wet etch is used to remove the second insulating layer 110. The barrier layer 104 is used as an etching stop. Next, a nitride wet etch is used to remove the barrier layer 104. The first insulating layer 102 is used as an etching stop.

Figure 5:
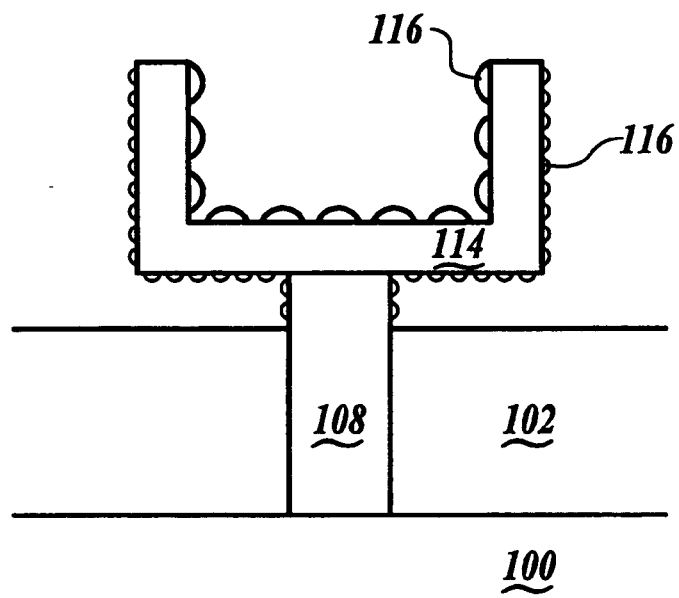

Turning to FIG. 5, a hemispherical grain (HSG) polysilicon 116 is formed on the surface of the exposed portion of the amorphous silicon plug 108 and the surface of the remaining composite amorphous silicon layer 114. The HSG polysilicon 116 on the bottom layer of the composite amorphous silicon layer 114 is smaller in size than the HSG polysilicon 116 on the top layer of the composite amorphous silicon layer 114 due to the higher dopant concentration of the bottom layer. The HSG polysilicon 116 is formed by a high vacuum anneal. An anneal temperature of the high vacuum is preferably between 560 to 660° C. In the preferred embodiment, the HSG polysilicon 116 is formed using a seeding and high vacuum technique. In summary, silane ($SiH_4$) or di-silane ($Si_2H_6$) is used to seed the surface of the amorphous silicon. Next, the HSG polysilicon is formed in a high vacuum. In this manner, the bottom storage node is formed.

In conventional methods, the amorphous silicon layer 114 has a single dopant concentration. When the amorphous silicon layer has a 6E20 atoms/cm$^3$ dopant concentration, HSG polysilicon cannot be formed on the amorphous silicon layer because the dopant concentration is too high. When the amorphous silicon layer has a 2E20 atoms/cm$^3$ dopant concentration, HSG polysilicon can be formed on the amorphous silicon layer. However, the low dopant concentration resulted in depletion problems. When the amorphous silicon layer has a 4E20 atoms/cm$^3$ dopant concentration, bald defect and selective loss concerns are present. In the present invention, three amorphous silicon layers are used. The top undoped layer is useful in increasing area gain through the formation of HSG polysilicon on the top undoped layer. The bottom layer also has a light dopant concentration at which HSG polysilicon can be formed. The middle highly doped layer eliminates the depletion problem.

Note that the resultant crown shaped capacitor has large sized grains of HSG polysilicon in the inner walls of the crown capacitor. On the outer walls of the crown capacitor, small sized grains of HSG polysilicon are formed. As noted above, this is due to the difference in doping concentrations. The formation of the small sized grains of HSG polysilicon aids in increasing the integration density of the DRAM cells. Specifically, FIG. 5 shows only a single DRAM capacitor. However, it can be appreciated that multiple DRAM capacitors are formed in serial fashion next to each other, often times in very close proximity to each other. In one embodiment, the DRAM capacitors are separated by about 0.15 microns. If large sized grains of HSG polysilicon are formed on the outer walls of the DRAM capacitor, then the HSG polysilicon of two capacitors may be in contact, resulting in short circuiting. Therefore, it is advantageous to have small sized grains of HSG polysilicon on the outer walls of the capacitor.

Finally, to complete the formation of the capacitor, a dielectric layer, such as oxide/nitride/oxide is formed over the bottom storage node. Then, a top storage node, such as polysilicon, is formed atop the dielectric layer.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a bottom storage node of a DRAM capacitor on a substrate, the method comprising the steps of forming a first insulating layer onto said substrate;

forming a barrier layer onto said first insulating layer;

patterning and etching said first insulating layer and said barrier layer, and stopping at said substrate, to form a contact opening;

forming an amorphous silicon plug into said contact opening;

forming a second insulating layer onto said amorphous silicon plug and said barrier layer;

patterning and etching said second insulating layer, stopping at said barrier layer, to form a trench above said amorphous silicon plug;

forming a bottom amorphous silicon layer along the bottom and sidewalls of said trench;

forming a middle amorphous silicon layer atop said bottom amorphous silicon layer;

forming a top amorphous silicon layer atop said middle amorphous silicon layer, wherein said top amorphous silicon layer is undoped, and wherein said middle amorphous silicon layer and said bottom amorphous silicon layer have different dopant concentrations greater than zero;

removing said second insulating layer;

removing said barrier layer to expose a portion of said amorphous silicon plug; and forming a hemispherical grain (HSG) polysilicon layer on surfaces of said top amorphous silicon layer and said bottom amorphous silicon layer and on exposed portion of said amorphous silicon plug.

2. The method of claim 1, wherein said first insulating layer is formed of TEOS oxide, BPSG, and HTO.

3. The method of claim 1, wherein said barrier layer is formed of silicon nitride.

4. The method of claim 1, wherein said second insulating layer is formed of silicon oxide.

5. The method of claim 1, wherein said middle amorphous silicon layer has a dopant concentration of 5E20 to 1E21 atoms/cm$^3$.

6. The method of claim 1, wherein said bottom amorphous silicon layer has a dopant concentration of 2E20 to 3E20 atoms/cm$^3$.

7. The method of claim 1, wherein said top amorphous silicon layer is 300–600 angstroms thick, said middle amorphous silicon layer is 400–800 angstroms thick, and said bottom amorphous silicon layer is 200–500 angstroms thick.

8. The method of claim 1, further including the steps of:

depositing a third dielectric layer over said bottom storage node; and forming a top storage node over said third dielectric layer.

9. A method for forming a bottom storage node of a DRAM capacitor on a substrate, the method comprising the steps of:

forming a first insulating layer onto said substrate;

forming a barrier layer onto said first insulating layer;

patterning and etching said first insulating layer and said barrier layer, and stopping at said substrate, to form a contact opening;

forming an amorphous silicon plug into said contact opening;

forming a second insulating layer onto said amorphous silicon plug and said barrier layer;

forming a trench in said second insulating layer above said amorphous silicon plug;

forming a bottom amorphous silicon layer along the bottom and sidewalls of said trench and atop said second insulating layer;

forming a middle amorphous silicon layer atop said bottom amorphous silicon layer;

forming a top amorphous silicon layer atop said middle amorphous silicon layer, wherein said top amorphous silicon layer is undoped, and wherein said middle amorphous silicon layer and said bottom amorphous silicon layer have different dopant concentrations greater than zero;

removing the portion of said top amorphous silicon layer, said middle amorphous silicon layer, and said bottom amorphous silicon layer atop said second insulating layer;

removing said second insulating layer;

removing said barrier layer to expose a portion of said amorphous silicon plug; and forming a hemispherical grain (HSG) polysilicon layer on surfaces of said top amorphous silicon layer and said bottom amorphous silicon layer and on exposed portion of said amorphous silicon plug.

10. The method of claim 9, wherein said first insulating layer is formed of TEOS oxide, BPSG, and HTO.

11. The method of claim 9, wherein said barrier layer is formed of silicon nitride.

12. The method of claim 9, wherein said second insulating layer is formed of silicon oxide.

13. The method of claim 9, wherein said middle amorphous silicon layer has a dopant concentration of 5E20 to 1E21 atoms/cm$^3$.

14. The method of claim 9, wherein said bottom amorphous silicon layer has a dopant concentration of 2E20 to 3E20 atoms/cm$^3$.

15. The method of claim 9, wherein said top amorphous silicon layer is 300–600 angstroms thick, said middle amorphous silicon layer is 400–800 angstroms thick, and said bottom amorphous silicon layer is 200–500 angstroms thick.

* * * * *